(12) United States Patent
Wildeson et al.

(10) Patent No.: US 12,408,481 B2
(45) Date of Patent: Sep. 2, 2025

(54) LIGHT EMITTING DIODE (LED) DEVICES WITH NUCLEATION LAYER

(71) Applicant: Lumileds LLC, San Jose, CA (US)

(72) Inventors: Isaac Wildeson, San Jose, CA (US); Toni Lopez, Aachen (DE); Hee-Jin Kim, San Jose, CA (US); Robert Armitage, Cupertino, CA (US); Parijat Deb, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 700 days.

(21) Appl. No.: 17/570,605

(22) Filed: Jan. 7, 2022

(65) Prior Publication Data

US 2022/0131028 A1    Apr. 28, 2022

Related U.S. Application Data

(63) Continuation-in-part of application No. 16/721,386, filed on Dec. 19, 2019, now Pat. No. 11,264,530.

(51) Int. Cl.
*H01L 33/00* (2010.01)
*H10H 20/01* (2025.01)
*H10H 20/819* (2025.01)
*H10H 20/825* (2025.01)

(52) U.S. Cl.
CPC .... *H10H 20/01335* (2025.01); *H10H 20/819* (2025.01); *H10H 20/825* (2025.01)

(58) Field of Classification Search
None
See application file for complete search history.

(56) References Cited

U.S. PATENT DOCUMENTS

| | | |
|---|---|---|
| 5,283,447 A | 2/1994 | Olbright et al. |
| 5,413,967 A | 5/1995 | Matsuda et al. |
| 5,952,681 A | 9/1999 | Chen |
| 6,822,991 B2 | 11/2004 | Collins, III et al. |
| 7,692,202 B2 | 4/2010 | Bensch |
| 8,022,421 B2 | 9/2011 | Hsueh et al. |
| 8,058,663 B2 | 11/2011 | Fan et al. |
| 8,114,691 B2 | 2/2012 | Lee et al. |
| 8,604,498 B2 | 12/2013 | Huang et al. |
| 8,654,802 B2 | 2/2014 | Kumei |
| 9,029,175 B2 | 5/2015 | Huang et al. |
| 9,130,353 B2 | 9/2015 | Lell et al. |

(Continued)

FOREIGN PATENT DOCUMENTS

| | | |
|---|---|---|
| CN | 101281946 A | 10/2008 |
| CN | 107068811 A | 8/2017 |

(Continued)

OTHER PUBLICATIONS

Abstract Translation WO 2017067333 (Year: 2017).*

(Continued)

*Primary Examiner* — Bradley Smith
(74) *Attorney, Agent, or Firm* — SERVILLA WHITNEY LLC

(57) ABSTRACT

Described are light emitting diode (LED) devices having patterned substrates and methods for effectively growing epitaxial III-nitride layers on them. A nucleation layer, comprising a III-nitride material, is grown on a substrate before any patterning takes place. The nucleation layer results in growth of smooth coalesced III-nitride layers over the patterns.

21 Claims, 9 Drawing Sheets

(56) References Cited

U.S. PATENT DOCUMENTS

| | | |
|---|---|---|
| 9,246,050 B2 | 1/2016 | Cha et al. |
| 9,419,031 B1 | 8/2016 | Or-Bach et al. |
| 9,537,050 B2 | 1/2017 | Gilet et al. |
| 9,876,141 B2 | 1/2018 | Lopez |
| 10,002,928 B1 | 6/2018 | Raring et al. |
| 10,050,080 B2 | 8/2018 | Gilet et al. |
| 10,090,437 B2 | 10/2018 | Timmering et al. |
| 10,103,195 B2 | 10/2018 | Damilano et al. |
| 10,249,800 B1 | 4/2019 | Lamkin |
| 10,355,168 B2 | 7/2019 | Lopez |
| 10,804,429 B2 | 10/2020 | Wildeson et al. |
| 2002/0187568 A1 | 12/2002 | Stockman |
| 2006/0060866 A1 | 3/2006 | Tezen |
| 2007/0158659 A1 | 7/2007 | Bensce |
| 2007/0170444 A1 | 7/2007 | Cao |
| 2008/0251799 A1 | 10/2008 | Kazuhiro |
| 2009/0078955 A1 | 3/2009 | Fan et al. |
| 2009/0090932 A1 | 4/2009 | Bour et al. |
| 2010/0117997 A1 | 5/2010 | Haase |
| 2011/0012109 A1 | 1/2011 | Kryliouk et al. |
| 2011/0027925 A1 | 2/2011 | Mitsuhiro |
| 2011/0163223 A1 | 7/2011 | Guidash |
| 2011/0233575 A1 | 9/2011 | Huang et al. |
| 2011/0256648 A1 | 10/2011 | Kelley et al. |
| 2012/0135557 A1* | 5/2012 | Okuno ............... H01L 21/0242 257/E33.023 |
| 2012/0276722 A1 | 11/2012 | Chyi et al. |
| 2013/0022063 A1 | 1/2013 | Masaya |
| 2013/0069191 A1 | 3/2013 | Or-Bach et al. |
| 2013/0193308 A1 | 8/2013 | Cellek et al. |
| 2013/0193448 A1 | 8/2013 | Chou et al. |
| 2013/0252361 A1 | 9/2013 | Li et al. |
| 2013/0320353 A1* | 12/2013 | Kryiouk ............ H01L 21/02488 257/76 |
| 2014/0065740 A1 | 3/2014 | Huang et al. |
| 2014/0191243 A1 | 7/2014 | Singh et al. |
| 2015/0024524 A1 | 1/2015 | Yao |
| 2015/0093121 A1 | 4/2015 | Manabu et al. |
| 2015/0093847 A1* | 4/2015 | Cha ................... H01L 21/02356 438/46 |
| 2015/0115290 A1 | 4/2015 | Guenard |
| 2015/0270434 A1 | 9/2015 | Hertkorn et al. |
| 2016/0197151 A1 | 7/2016 | Han et al. |
| 2017/0025567 A1 | 1/2017 | Lu et al. |
| 2017/0098746 A1 | 4/2017 | Bergmann et al. |
| 2017/0181241 A1 | 6/2017 | Hoe |
| 2017/0213868 A1 | 7/2017 | Damilano et al. |
| 2017/0264080 A1 | 9/2017 | Lell et al. |
| 2017/0301799 A1* | 10/2017 | Boles ................... H01L 29/861 |
| 2017/0323788 A1 | 11/2017 | Mi et al. |
| 2017/0338373 A1 | 11/2017 | Wildeson et al. |
| 2018/0012929 A1 | 1/2018 | Lu et al. |
| 2018/0019359 A1 | 1/2018 | Kayes et al. |
| 2018/0104130 A1 | 4/2018 | Sampson et al. |
| 2018/0182919 A1* | 6/2018 | Okuno ................... H01L 33/06 |
| 2018/0269352 A1 | 9/2018 | Tian et al. |
| 2018/0269532 A1 | 9/2018 | Tian et al. |
| 2019/0006178 A1 | 1/2019 | Huang et al. |
| 2019/0006821 A1 | 1/2019 | Tang et al. |
| 2019/0035624 A1* | 1/2019 | Snure ............... H01L 21/02502 |
| 2019/0052061 A1 | 2/2019 | Kondo |
| 2019/0074404 A1 | 3/2019 | Young et al. |
| 2019/0148586 A1 | 5/2019 | Zhang et al. |
| 2019/0198561 A1 | 6/2019 | Wildeson et al. |
| 2019/0198709 A1 | 6/2019 | Wildeson et al. |
| 2019/0229234 A1 | 7/2019 | Zou et al. |
| 2019/0279558 A1 | 9/2019 | Monestier et al. |
| 2020/0194549 A1* | 6/2020 | Dasgupta ............ H01L 29/778 |
| 2021/0118680 A1 | 4/2021 | Stoffels et al. |

FOREIGN PATENT DOCUMENTS

| | | |
|---|---|---|
| DE | 102010002966 A1 | 9/2011 |
| EP | 2743966 A1 | 6/2014 |
| JP | 2002324915 A | 11/2002 |
| JP | 2005236667 A | 9/2005 |
| JP | 6245319 B1 | 12/2017 |
| KR | 20160133838 A | 11/2016 |
| KR | 20170129009 | 11/2017 |
| KR | 1020170129009 A | 11/2017 |
| WO | 2005073485 A2 | 8/2005 |
| WO | 2012077884 A1 | 6/2012 |
| WO | 2017067333 A1 | 4/2017 |

OTHER PUBLICATIONS

"Continuation of "IEEE 802.15.7-2011—IEEE Standard for Local and Metropolitan Area Networks—Part 15.7: Short-Range Wireless Optical Communication Using Visible Light (2011 )", pp. 151-309".

"European Search Report in 2019P00039EP01, Jun. 30, 2020, 8 pages".

"European Search Report in 2019P00039EP01. mailed on Sep. 7, 2020, 8 pages".

"European Search Report in 2019P00040EP01. mailed on Jun. 23, 2020, 10 pages".

"Final Office Action in U.S. Appl. No. 16/228,311 dated Nov. 29, 2019, 14 pages".

"Final Office Action in U.S. Appl. No. 16/721,285 dated Jun. 24, 2021, 12 pages".

"IEEE 802.15.7-2011—IEEE Standard for Local and Metropolitan Area Networks—Part 15.7: Short-Range Wireless Optical Communication Using Visible Light (2011)".

"LUXEON FlipChip Royal Blue", High current density Chip Scale Package (CSP) LED, Product Brief, Jul. 22, 2016, 2 pages.

"Non-Final Office Action in U.S. Appl. No. 16/228,211, mailed on Apr. 15, 2020, 17 pages".

"Non-Final Office Action in U.S. Appl. No. 16/228,311, mailed on Apr. 17, 2020, 12 pages".

"Non-Final Office Action in U.S. Appl. No. 16/721,285 dated Aug. 18, 2021, 11 pages".

"Non-Final Office Action in U.S. Appl. No. 16/721,285, mailed on Apr. 14, 2021, 12 pages".

"Non-Final Office Action in U.S. Appl. No. 16/721,386 dated Jul. 14, 2021, 11 pages".

"Non-Final Office Action in U.S. Appl. No. 17/010,300, mailed on Feb. 19, 2021, 12 pages".

"PCT International Search Report and Written Opinion in PCT/US2020/060961 dated Mar. 4, 2021, 11 pages".

"TracePro's accurate LED source modeling improves the performance of optical design simulations.", Lambda Research Corporation, Technical Article, Mar. 2015, 13 pages.

Chang , et al., "Cascaded GaN Light-Emitting Diodes with Hybrid Tunnel Junction Layers", IEEE Journal of Quantum Electronics, vol. 51, No. 8, pp. 1-5, Art No. 3300505 (Aug. 2015).

El-Ghoroury , "Growth of monolithic full-color GaN-based LED with intermediate carrier blocking layers", AIP Advances 6, 075316 (2016).

Liu, Zongyuan , et al., "Precise optical modeling of blue light-emitting diodes by Monte Carlo ray-tracing", Optics Express, Apr. 26, 2010, vol. 18, No. 9, pp. 9398-9412.

Okumura , et al., "Backward diodes using heavily Mg-doped GaN growth by ammonia molecular-beam epitaxy", Appl. Phys. Lett. 108, 072102 (2016).

Schubert , "Interband tunnel junctions for wurtzite III-nitride semiconductors based on heterointerface polarization charages", Phys. Rev. B 81, 035303 (2010).

* cited by examiner

LIGHT EMITTING DIODE (LED) DEVICES WITH NUCLEATION LAYER

CROSS-REFERENCE TO RELATED APPLICATIONS

This application is a Continuation-In-Part of U.S. application Ser. No. 16/721,386, filed Dec. 19, 2019, the entire disclosure of which is hereby incorporated by reference herein.

TECHNICAL FIELD

Embodiments of the disclosure generally relate to light emitting diode (LED) devices and methods of manufacturing the same. More particularly, embodiments are directed to light emitting diode devices that include a nucleation layer on a substrate prior to any patterning and methods for depositing a nucleation layer onto a substrate epitaxial growing a III-nitride layer thereon.

BACKGROUND

A light emitting diode (LED) is a semiconductor light source that emits visible light when current flows through it. LEDs combine a P-type semiconductor with an N-type semiconductor. LEDs commonly use a III-group compound semiconductor. A III-group compound semiconductor provides stable operation at a higher temperature than devices that use other semiconductors. The III-group compound is typically formed on a substrate formed of sapphire or silicon carbide (SiC).

Direct light emitters based on patterned sapphire substrate (PSS) LEDs suffer from low luminance levels and broad angular emission patterns due to their inherent geometrical features (light is emitted from 5 sides of the chip, including the four side surfaces). These limitations can be mitigated by the use of side-coating materials to prevent light escaping from the sides of the chip and enforce light emission only from the top substrate surface. Side coating materials, however, significantly penalize light extraction efficiency (ExE), particularly in domeless emitters, as the side-coat increases light trapping in the die and it itself is not 100% reflective.

Therefore, there is a need for light emitting diode (LED) devices with high luminance levels and high light extraction efficiency.

SUMMARY

Embodiments of the disclosure are directed to light emitting diode (LED) devices. In an embodiment, a light emitting diode (LED) device comprises a nucleation layer on a substrate, the nucleation layer comprising a first III-nitride material; a patterned dielectric layer on a top surface of the nucleation layer, the patterned dielectric layer comprising a plurality of features and having a plurality of spaces between the plurality of features; and a III-nitride layer on the plurality of features and on the plurality of spaces, the III-nitride layer comprising a second III-nitride material.

The first III-nitride material and the second III-nitride material may independently be one or more of aluminum, gallium, and indium. In one or more embodiments, the first III-nitride material and the second III-nitride material independently comprises one or more of aluminum, gallium, and indium.

The first III-nitride material may be aluminum nitride (AlN). In one or more embodiments, the first III-nitride material comprises aluminum nitride (AlN).

The first III-nitride material and the second III-nitride material may be the same. In one or more embodiments, the first III-nitride material and the second III-nitride material are the same The dielectric layer may have a low refractive index material having a refractive index in a range of from about 1.2 to about 2. In one or more embodiments, the dielectric layer comprises a low refractive index material having a refractive index in a range of from about 1.2 to about 2

The dielectric layer may be one or more of silicon oxide ($SiO_2$) and silicon nitride ($Si_3N_4$). In one or more embodiments, the dielectric layer comprises one or more of silicon oxide ($SiO_2$) and silicon nitride ($Si_3N_4$)

The second III-nitride material may be gallium nitride (GaN). In one or more embodiments, the second III-nitride material comprises gallium nitride (GaN)

The nucleation layer may have a thickness in a range of from about 5 nm to about 100 nm. In one or more embodiments, the nucleation layer has a thickness in a range of from about 5 nm to about 100 nm.

The plurality of features may be holes. In one or more embodiments, the plurality of features comprises holes.

The plurality of features may protrude from a top surface of the nucleation layer and the plurality of spaces may expose a top surface of the nucleation layer. In one or more embodiments, the plurality of features protrude from a top surface of the nucleation layer and the plurality of spaces expose a top surface of the nucleation layer.

The plurality of features may have a shape selected from a hemispherical shape, a triangular pyramidal shape, a quadrangular pyramidal shape, a hexagonal pyramidal shape, a conical shape, a semi-spherical shape, or a cut-spherical shape. In one or more embodiments, the plurality of features has a shape selected from a hemispherical shape, a triangular pyramidal shape, a quadrangular pyramidal shape, a hexagonal pyramidal shape, a conical shape, a semi-spherical shape, or a cut-spherical shape.

The plurality of features may have a height in a range of from about 100 nm to about 3 µm, a pitch in a range of from about 50 nm to about 5000 nm, and a width in a range of from about 5 nm to about 500 nm. In one or more embodiments, the plurality of features has a height in a range of from about 100 nm to about 3 µm, a pitch in a range of from about 50 nm to about 5000 nm, and a width in a range of from about 5 nm to about 500 nm Embodiments of the disclosure are directed to methods of manufacturing light emitting diode (LED) devices. In one or more embodiments, a method of manufacturing a light emitting diode (LED) device comprises: depositing a nucleation layer on a substrate, the nucleation layer comprising a first III-nitride material; depositing a dielectric layer on a top surface of the nucleation layer, the dielectric layer comprising a low refractive index dielectric material; patterning the dielectric layer to form a patterned surface having a plurality of features and a plurality of spaces between the plurality of features; and epitaxially growing a III-nitride layer on the patterned surface, the III-nitride layer comprising a second III-nitride material.

The plurality of features may protrude from a top surface of the nucleation layer and may have a height and a width and sidewalls, and the plurality of spaces may expose the top surface of the nucleation layer. In one or more embodiments, the plurality of features protrude from a top surface of the nucleation layer and have a height and a width and sidewalls, and the plurality of spaces expose the top surface of the nucleation layer.

The III-nitride layer may grow on the exposed top surface of the nucleation layer and may not grow on the sidewalls of the plurality of features. In one or more embodiments, the III-nitride layer grows on the exposed top surface of the nucleation layer and does not grow on the sidewalls of the plurality of features The nucleation layer and the dielectric layer may be independently deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD). In one or more embodiments, the nucleation layer and the dielectric layer are independently deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD).

The plurality of features may be holes, and the holes may expose a top surface of the nucleation layer. In one or more embodiments, the plurality of features comprises holes, and the holes expose a top surface of the nucleation layer One or more embodiments of the disclosure are directed to light emitting diode (LED) devices. In an embodiment, a light emitting diode (LED) device comprises: a patterned substrate comprising a substrate body, a plurality of integral features protruding from the substrate body, and a base surface defined by a plurality of voids between the plurality of integral features, the plurality of integral features having a top surface and sidewalls and a height, a pitch, and a width; a nucleation layer on a top surface of the plurality of integral features and not in the plurality of voids, the nucleation layer comprising a first III-nitride material; and a III-nitride layer on the nucleation layer, the III-nitride layer comprising a second III-nitride material.

The first III-nitride material and the second III-nitride material may independently be one or more of aluminum, gallium, and indium. In one or more embodiments, the first III-nitride material and the second III-nitride material independently comprise one or more of aluminum, gallium, and indium.

Additional embodiments of the disclosure are directed to methods of manufacturing light emitting diode (LED) devices. In an embodiment, a method of manufacturing the light emitting diode (LED) device of the nineteenth embodiment comprises depositing the nucleation layer on the substrate, the nucleation layer comprising the first III-nitride material; patterning the substrate to form nucleation layer-coated substrate posts separated by the plurality of voids; and epitaxially growing the III-nitride layer on the nucleation layer-coated substrate posts, the III-nitride layer comprising the second III-nitride material.

Other embodiments are directed to light emitting diode devices. In one or more embodiments, a light emitting diode device comprises: a patterned dielectric layer on a substrate, the patterned dielectric layer comprising a plurality of features and having a plurality of voids between the plurality of features, wherein the plurality of features have a top surface and sidewalls; a first III-nitride layer on the plurality of features and on the plurality of spaces, the first III-nitride layer comprising a first III-nitride material, wherein the first III-nitride layer is on a bottom portion of the sidewalls of the plurality of features and on the plurality of spaces, and wherein the III-nitride layer is not on an upper portion of the sidewalls of the plurality of features; a second III-nitride layer on the first III-nitride layer, the second III-nitride layer comprises a second III-nitride material; an anode layer on the second III-nitride layer; and a cathode layer in a cathode via.

Additional embodiments are directed to methods of manufacturing light emitting diode devices. In one or more embodiments, a method of manufacturing comprises: depositing a nucleation layer on a substrate, the nucleation layer comprising a nucleation III-nitride material, the nucleation layer having a thickness in a range of from about 5 nm to about 100 nm; depositing a dielectric layer on a top surface of the nucleation layer, the dielectric layer comprising a low refractive index dielectric material; patterning the dielectric layer to form a patterned surface having a plurality of features and a plurality of spaces between the plurality of features, the plurality of features having a top surface and sidewalls, the sidewalls having a bottom portion and an upper portion; epitaxially growing a first III-nitride layer on the patterned surface, the first III-nitride layer comprising a first III-nitride material, wherein the first III-nitride layer is grown on the bottom portion of the sidewalls of the plurality of features and on the plurality of spaces, and wherein the first III-nitride layer is not grown on the upper portion of the sidewalls of the plurality of features; and epitaxially growing a second III-nitride layer on the first III-nitride layer, the second III-nitride layer forming a plurality of voids from the plurality of spaces.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
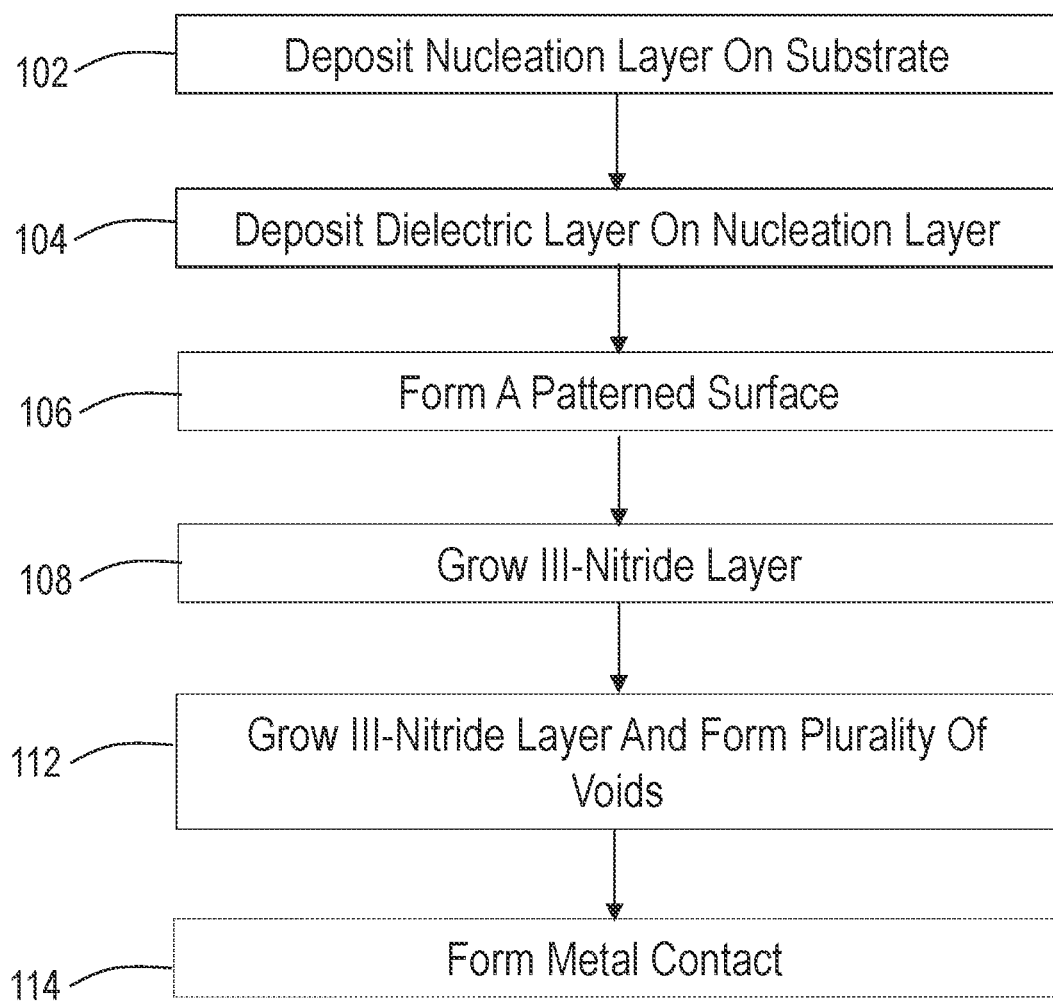
FIG. 1 illustrates a process flow diagram for a method according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "substrate" as used herein according to one or more embodiments refers to a structure, intermediate or final, having a surface, or portion of a surface, upon which a process act. In addition, reference to a substrate in some embodiments also refers to only a portion of the substrate, unless the context clearly indicates otherwise. Further, reference to depositing on a substrate according to some embodiments includes depositing on a bare substrate, or on a substrate with one or more films or features or materials deposited or formed thereon.

In one or more embodiments, the "substrate" means any substrate or material surface formed on a substrate upon which film processing is performed during a fabrication process. In exemplary embodiments, a substrate surface on which processing is performed includes materials such as silicon, silicon oxide, silicon on insulator (SOI), strained silicon, amorphous silicon, doped silicon, carbon doped silicon oxides, germanium, gallium arsenide, glass, sapphire, and any other suitable materials such as metals, metal nitrides, III-nitrides (e.g., GaN, AlN, InN and alloys), metal alloys, and other conductive materials, depending on the application. Substrates include, without limitation, light emitting diode (LED) devices. Substrates in some embodiments are exposed to a pretreatment process to polish, etch, reduce, oxidize, hydroxylate, anneal, UV cure, e-beam cure and/or bake the substrate surface. In addition to film processing directly on the surface of the substrate itself, in some embodiments, any of the film processing steps disclosed are also performed on an underlayer formed on the substrate, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

Embodiments described herein describe different kinds of patterned substrates and methods for effectively growing epitaxial III-nitride layers on them. In one or more embodiments, a nucleation layer, comprising a III-nitride material, is advantageously grown on a substrate before any patterning takes place. Without intending to be bound by theory, it is thought that this nucleation layer is important for subsequent growth of smooth coalesced III-nitride layers over the patterns. In one or more embodiments, a thin III-nitride layer, a nucleation layer, is formed (e.g., deposited) on a substrate prior to forming (e.g., depositing) a dielectric layer and forming the dielectric pattern features. Due to the deposition of the nucleation layer prior to dielectric deposition, the next process step of III-nitride material growth after a dielectric patterning step can be initiated at a high growth temperature. Initiating this step at a high growth temperature makes possible selective area deposition, i.e., the III-nitride material is deposited only on exposed areas of the nucleation layer and not on the dielectric material. Selective area deposition facilitates the use of patterned feature geometries with improved efficient light extraction properties, that would be difficult or impossible to use following a conventional growth sequence in which a nucleation layer is deposited after patterning the dielectric.

FIG. 1 depicts a flow diagram of a method 100 of manufacturing a light emitting diode (LED) device in accordance with one or more embodiments of the present disclosure. With reference to FIG. 1, in one or more embodiments, the method begins at operation 102 by depositing a nucleation layer on a substrate. At operation 104 a dielectric layer is deposited on the nucleation layer. At operation 106, a patterned surface is formed. At operation 108, a III-nitride layer is grown, e.g., epitaxially, on the areas of the nucleation layer which are not covered by dielectric material. At operation 112, a second III-nitride layer is formed on the first III-nitride layer, forming voids. At operation 114, a metal contact is formed.

Figure 2A:
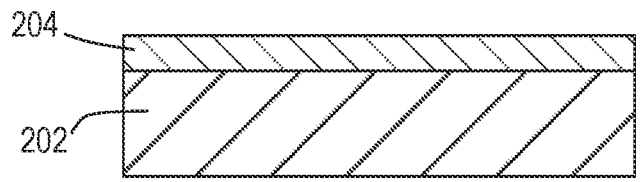
FIG. 2A illustrates a cross-sectional view of a light emitting diode (LED) device according to one or more embodiments.

FIG. 2A is cross-section view of a LED device according to one or more embodiments. With reference to FIG. 2A, a nucleation layer 204 is deposited on a substrate 202.

The substrate may be any substrate known to one of skill in the art. In one or more embodiments, the substrate comprises one or more of sapphire, silicon carbide, silicon (Si), quartz, magnesium oxide (MgO), zinc oxide (ZnO), spinel, and the like. In one or more embodiments, the substrate is not patterned prior to deposition of the nucleation layer. Thus, in some embodiments, the substrate is not patterned and can be considered to be flat or substantially flat. Accordingly, in one or more embodiments, the method of the disclosure differs significantly from the conventional patterned substrate, e.g., patterned sapphire substrate (PSS), fabrication approach in which pattern features are etched directly into the substrate before deposition of a nucleation layer.

Without intending to be bound by theory, it is thought that the deposition of a nucleation layer 204 on the substrate 202 prior to patterning provides critical advantages. In one or more embodiments, it was found that the deposition of a nucleation layer 204 on the substrate 202 prior to patterning provided performance improvements for directional emitters with the growth substrate remaining attached in the finished device. In one or more embodiments, the performance improvements include increased light extraction efficiency (ExE) in emitters without a lens (dome), increased brightness, and increased angular directionality (forward gain, effective increased lumen output within a narrow angular emission cone (e.g., 45 degrees).

In one or more embodiments, the nucleation layer 204 comprises a III-nitride material. In some embodiments, the III-nitride material comprises one or more of gallium (Ga), aluminum (Al), and indium (In). Thus, in some embodiments, the nucleation layer 204 comprises one or more of gallium nitride (GaN), aluminum nitride (AlN), indium nitride (InN), gallium aluminum nitride (GaAlN), gallium indium nitride (GaInN), aluminum gallium nitride (AlGaN), aluminum indium nitride (AlInN), indium gallium nitride (InGaN), indium aluminum nitride (InAlN), and the like. In one or more specific embodiments, the nucleation layer 204 comprises aluminum nitride (AlN).

In one or more embodiments, the nucleation layer 204 has a thickness in a range of from about 5 nm to about 100 nm, including a range of from about 10 nm to 75 nm, a range of from about 5 nm to about 90 nm, a range of from about 10 nm to about 60 nm, a range of from about 5 nm to about 50 nm, a range of from about 10 nm to about 50 nm, and a range of from about 10 nm to about 90 nm.

In one or more embodiments, the nucleation layer 204 is deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD).

"Sputter deposition" as used herein refers to a physical vapor deposition (PVD) method of thin film deposition by sputtering. In sputter deposition, a material, e.g., III-nitride, is ejected from a target that is a source onto a substrate. The technique is based on ion bombardment of a source material, the target. Ion bombardment results in a vapor due to a purely physical process, i.e., the sputtering of the target material.

As used according to some embodiments herein, "atomic layer deposition" (ALD) or "cyclical deposition" refers to a vapor phase technique used to deposit thin films on a substrate surface. The process of ALD involves the surface of a substrate, or a portion of substrate, being exposed to alternating precursors, i.e., two or more reactive compounds, to deposit a layer of material on the substrate surface. When the substrate is exposed to the alternating precursors, the precursors are introduced sequentially or simultaneously. The precursors are introduced into a reaction zone of a processing chamber, and the substrate, or portion of the substrate, is exposed separately to the precursors.

As used herein according to some embodiments, "chemical vapor deposition" refers to a process in which films of materials are deposited from the vapor phase by decomposition of chemicals on a substrate surface. In CVD, a substrate surface is exposed to precursors and/or co-reagents simultaneous or substantially simultaneously. As used herein, "substantially simultaneously" refers to either co-flow or where there is overlap for a majority of exposures of the precursors.

As used herein according to some embodiments, "plasma enhanced atomic layer deposition (PEALD)" refers to a technique for depositing thin films on a substrate. In some examples of PEALD processes relative to thermal ALD processes, a material may be formed from the same chemical precursors, but at a higher deposition rate and a lower temperature. A PEALD process, in general, a reactant gas and a reactant plasma are sequentially introduced into a process chamber having a substrate in the chamber. The first reactant gas is pulsed in the process chamber and is adsorbed onto the substrate surface. Thereafter, the reactant plasma is pulsed into the process chamber and reacts with the first reactant gas to form a deposition material, e.g., a thin film on a substrate. Similar to a thermal ALD process, a purge step may be conducted between the delivery of each of the reactants.

As used herein according to one or more embodiments, "plasma enhanced chemical vapor deposition (PECVD)" refers to a technique for depositing thin films on a substrate. In a PECVD process, a source material, which is in gas or liquid phase, such as a gas-phase III-nitride material or a vapor of a liquid-phase III-nitride material that have been entrained in a carrier gas, is introduced into a PECVD chamber. A plasma-initiated gas is also introduced into the chamber. The creation of plasma in the chamber creates excited radicals. The excited radicals are chemically bound to the surface of a substrate positioned in the chamber, forming the desired film thereon.

Figure 2B:
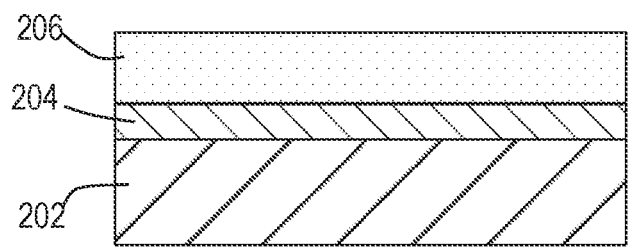
FIG. 2B illustrates a cross-sectional view of a light emitting diode (LED) device according to one or more embodiments.

FIG. 2B is cross-section view of a LED device according to one or more embodiments. With reference to FIG. 2B, a dielectric layer 206 is deposited on the nucleation layer 204.

As used herein, the term "dielectric" refers to an electrical insulator material that can be polarized by an applied electric field. In one or more embodiments, the dielectric layer includes, but is not limited to, oxides, e.g., silicon oxide ($SiO_2$), aluminum oxide ($Al_2O_3$), nitrides, e.g., silicon nitride ($Si_3N_4$). In one or more embodiments, the dielectric layer comprises silicon nitride ($Si_3N_4$). In one or more embodiments, the dielectric layer comprises silicon oxide ($SiO_2$). In some embodiments, the dielectric layer composition is non-stoichiometric relative to the ideal molecular formula. For example, in some embodiments, the dielectric layer includes, but is not limited to, oxides (e.g., silicon oxide, aluminum oxide), nitrides (e.g., silicon nitride (SiN)), oxycarbides (e.g., silicon oxycarbide (SiOC)), and oxynitrocarbides (e.g., silicon oxycarbonitride (SiNCO)).

In one or more embodiments, the dielectric layer 206 comprises a material with a low refractive index. In one or more embodiments, the dielectric layer 206 comprising a dielectric material having a refractive index in a range of from about 1.2 to about 2.

In one or more embodiments, the dielectric layer 206 is deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD).

In one or more embodiments, the dielectric layer 206 has a thickness in a range of from about 50 nm to about 5 μm, including from about 100 nm to about 4 μm, from about 50 nm to about 4 μm, from about 200 nm to about 3 μm.

Figure 2C:
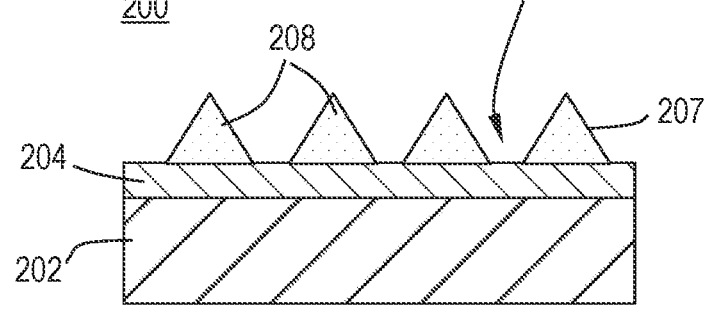
FIG. 2C illustrates a cross-sectional view of a light emitting diode (LED) device according to one or more embodiments.

FIG. 2C is cross-section view of a LED device according to one or more embodiments. With reference to FIG. 2C, a patterned surface is formed. Thus, in one or more embodiments, a patterned dielectric layer 207 is formed. In one or more embodiments, the dielectric layer 206 is patterned according to any appropriate patterning technique known to one of skill in the art. In some embodiments, the patterned dielectric layer 207 comprises a plurality of features 208 protruding from the top surface of the nucleation layer 204 and having a plurality of spaces 210 between the plurality of features 208.

In one or more embodiments, the plurality of features 208 protruding from the surface of the nucleation layer 204 can have any shape known to one of skill in the art. FIGS. 3A-3F illustrate perspective views of a light emitting diode (LED) device according to one or more embodiments. Specifically, FIGS. 3A-3F illustrate various embodiments of the shapes of the plurality of features 208 protruding from the top surface of the nucleation layer 204.

Figure 3A:
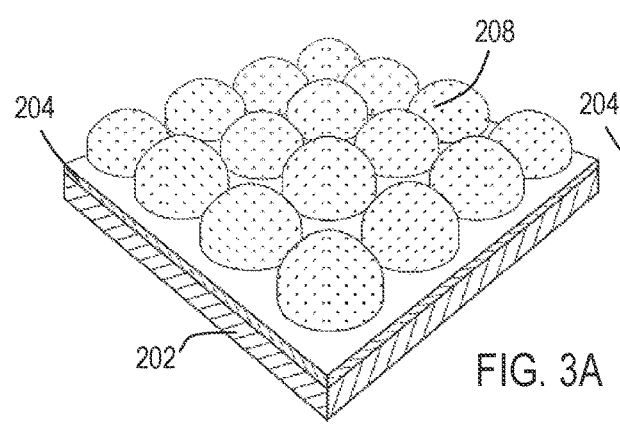
FIGS. 3A-3F illustrate perspective views of a light emitting diode (LED) device according to one or more embodiments.
Figure 3B:
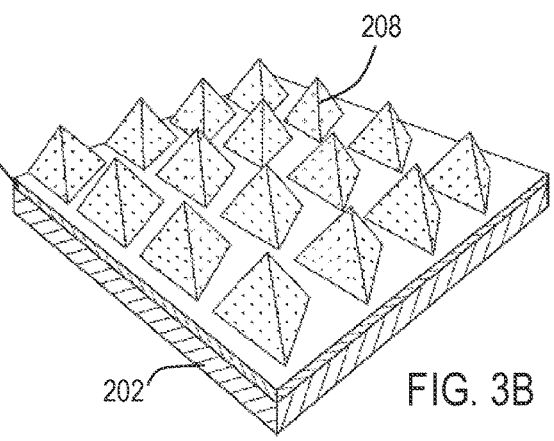
Figure 3C:
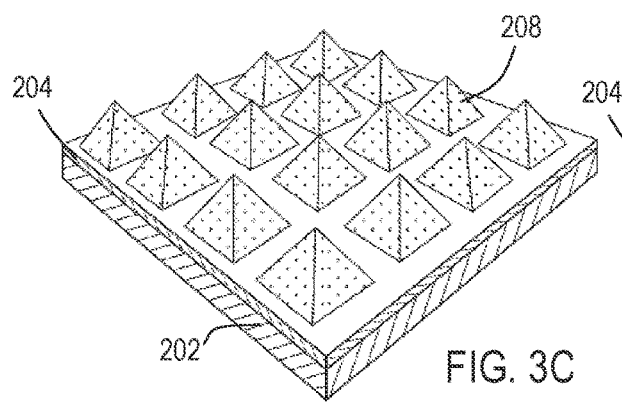
Figure 3D:
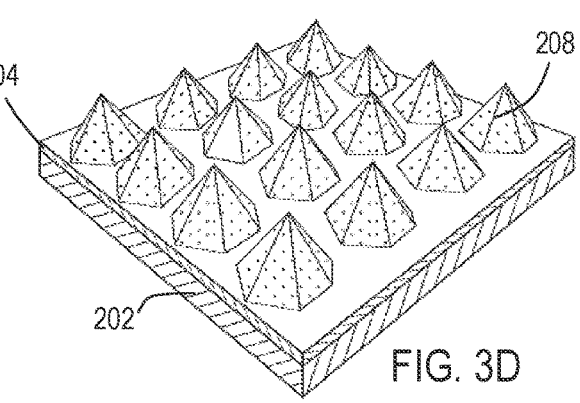
Figure 3E:
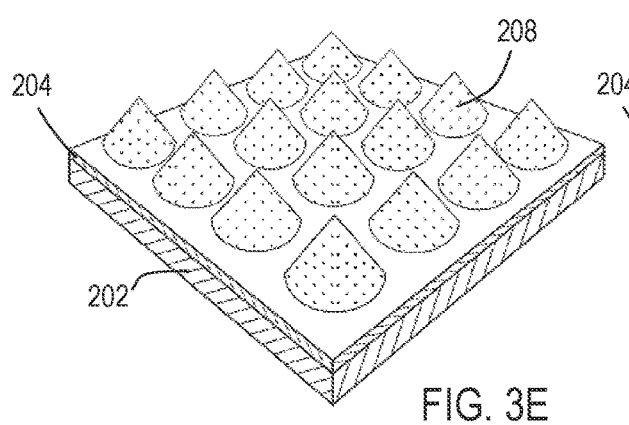
Figure 3F:
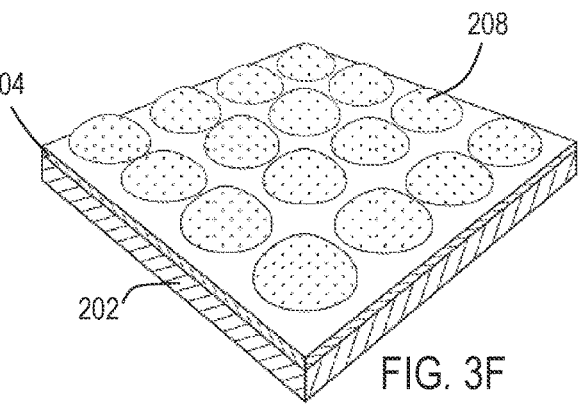

In one or more embodiments, the shape of the plurality of protruding features 208 includes, but is not limited to, a hemispherical shape (FIG. 3A), a triangular pyramidal shape (FIG. 3B), a quadrangular pyramidal shape (FIG. 3C), a hexagonal pyramidal shape (FIG. 3D), a conical shape (FIG. 3E), a semi-spherical shape or a cut-spherical shape (FIG. 3F).

In one or more embodiments, the plurality of features 208 protruding from the surface of the nucleation layer 204 has a height in a range of from about 100 nm to about 3 µm, include a range of from about 500 nm to about 2 µm, a range of from about 100 nm to about 1 µm, a range of from about 250 nm to about 2.5 µm, and a range of from about 100 nm to about 2 µm.

In one of more embodiments, the plurality of features 208 protruding from the surface of the nucleation layer 204 has a pitch in a range of from about 50 nm to about 5000 nm, including a range from about 500 nm to about 2000 nm, and a range of from about 500 nm to about 1000 nm.

In one or more embodiments, the plurality of features 208 protruding from the surface of the nucleation layer 204 has a width in a range of from about 5 nm to about 500 nm, including a range from about 10 nm to about 500 nm, and a range of from about 5 nm to about 300 nm.

In one or more specific embodiments, a hexagonal pattern of a plurality of features 208 protruding from the surface of the nucleation layer 204 having a pitch of about 1000 nm and a circle diameter of about 200 nm is transferred to a photoresist coating (not illustrated) on the dielectric layer 206 using nanoimprint lithography. In one or more embodiments, the substrate 202 is etched in a reactive ion etching (RIE) tool using conditions that etch the dielectric layer 206 efficiently but etch the nucleation layer 204 very slowly or not at all. In other words, the etching is selective to the dielectric layer 206 over the nucleation layer 204. In one or more embodiments, the photoresist is removed, and the wafer is cleaned, resulting in a hexagonal array of cones the dielectric layer 204. In one or more embodiments, the half-angle of the plurality of features 208 is controlled by adjusting parameters such as the thickness of the starting dielectric layer 206, thickness of photoresist layer (not illustrated), and differences in RIE etch rates that depend on surface angles and/or materials.

Figure 2D:
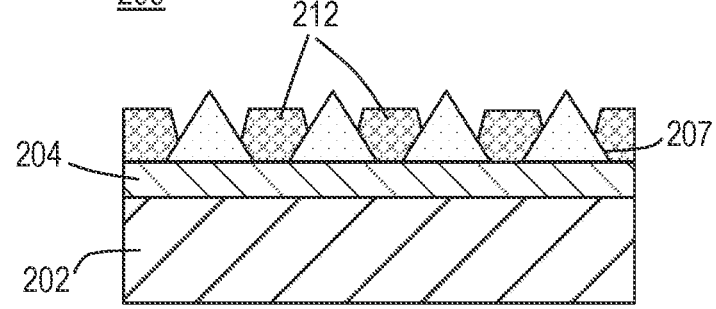
FIG. 2D illustrates a cross-sectional view of a light emitting diode (LED) device according to one or more embodiments.

FIG. 2D is cross-section view of a LED device according to one or more embodiments. With reference to FIG. 2D, a III-nitride layer 212 is grown, e.g., epitaxially, on the patterned dielectric layer 207. In one or more embodiments, a III-nitride layer is grown on the nucleation layer 204 and in or on the plurality of spaces 210 between the plurality of features 208, and not on the dielectric layer 206. In one or more embodiments, the plurality of features 208 have at least one sidewall (not illustrated), and the III-nitride layer does not grow on the at least one sidewall of the plurality of features 208.

In one or more embodiments, the III-nitride layer 212 comprises a III-nitride material. In some embodiments, the III-nitride material comprises one or more of gallium (Ga), aluminum (Al), and indium (In). Thus, in some embodiments, the III-nitride layer 212 comprises one or more of gallium nitride (GaN), aluminum nitride (AlN), indium nitride (InN), gallium aluminum nitride (GaAlN), gallium indium nitride (GaInN), aluminum gallium nitride (AlGaN), aluminum indium nitride (AlInN), indium gallium nitride (InGaN), indium aluminum nitride (InAlN), and the like. In one or more specific embodiments, the III-nitride layer 212 comprises gallium nitride. In some embodiments, the III-nitride layer 212 and the nucleation layer 204 comprise the same III-nitride material. In other embodiments, the III-nitride layer 212 and the nucleation layer 204 comprise different III-nitride materials. In a specific embodiment, the nucleation layer 204 comprises aluminum nitride (AlN) and the III-nitride layer 212 comprises gallium nitride (GaN).

In one or more embodiments, the III-nitride layer 212 is placed in a metalorganic vapor-phase epitaxy (MOVPE) reactor for epitaxy of LED device layers. Unlike during a typical MOVPE growth run, which starts with a low temperature nucleation layer, in one or more embodiments the MOVPE process starts with high temperature III-nitride growth taking advantage of the large difference in III-nitride nucleation rates on the pre-deposited nucleation layer 204 versus the surfaces of patterned dielectric layer 207 and plurality of features 208. In one or more embodiments, after the epitaxy, e.g., MOVPE, growth run, the device 200 is processed as is typical for a conventional PSS based LED.

In one or more embodiments, pre-deposition of the nucleation layer 204 allows high temperature selective area growth around the plurality of features 208, and, thus, more freedom in pattern feature geometry since nucleation of unwanted misoriented grains on the pattern features is avoided. In one or more embodiments, the temperature at which the III-nitride layer is grown is in a range of from about 800° C. to about 1200° C., or from about 950° C. to about 1150° C.

Figure 2E:
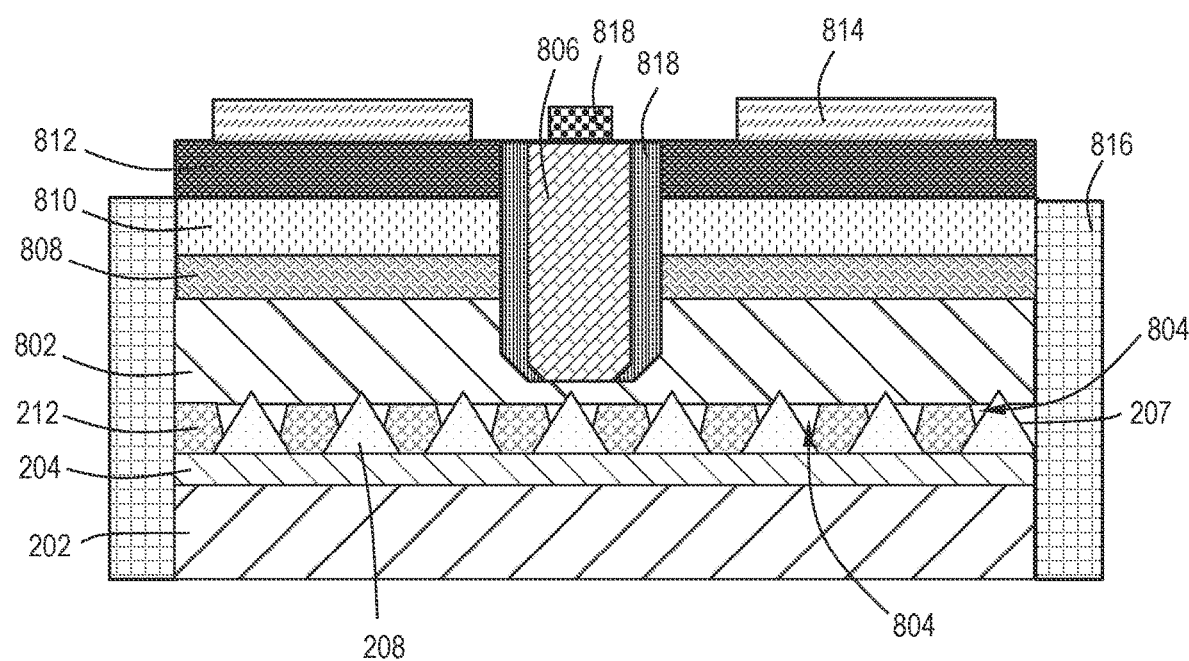
FIG. 2E illustrates a cross-sectional view of a light emitting diode (LED) device according to one or more embodiments.

FIG. 2E is a cross-section view of an LED device according to one or more embodiments. With reference to FIG. 2E, a second III-nitride layer 802 is grown, e.g., epitaxially, on the III-nitride layer 212. In one or more embodiments, because the plurality of features 208 have at least one sidewall that the III-nitride layer 212 does not nucleate on, when the III-nitride layer 802 is grown, a plurality of voids 804 is formed. The plurality of voids 804 may have any shape or size. In some embodiments, the plurality of voids 804 are bounded by the plurality of features 208 of the patterned dielectric layer 207, by the II-nitride layer 212, and by the III-nitride layer 802. In one or more embodiments, the plurality of voids 804 does not contact the nucleation layer 204.

In one or more embodiments, the plurality of voids 804 has a pitch in a range of from about 50 nm to about 5000 nm, including a range from about 500 nm to about 2000 nm, and a range of from about 500 nm to about 1000 nm. In one or more embodiments, the plurality of voids 804 has a width in a range of from about 5 nm to about 500 nm, including a range from about 10 nm to about 500 nm, and a range of from about 5 nm to about 300 nm. The voids typically have a distribution of different shapes and sizes and are not necessarily bounded on any of their sides by one of the features 208. When viewed in cross-section, the voids may appear in the shape of scalene triangle, or an approximately scalene triangle with rounded vertices. Some voids may appear elliptical in cross-section. The size of each void is typically less than 500 nm and can be in a range of from 10 nm to 100 nm. A distribution of various sizes of voids can be found within the same device.

In one or more embodiments, the III-nitride layer 802 comprises a III-nitride material. In some embodiments, the III-nitride material comprises one or more of gallium (Ga), aluminum (Al), and indium (In). Thus, in some embodiments, the III-nitride layer 802 comprises one or more of gallium nitride (GaN), aluminum nitride (AlN), indium nitride (InN), gallium aluminum nitride (GaAlN), gallium indium nitride (GaInN), aluminum gallium nitride (AlGaN), aluminum indium nitride (AlInN), indium gallium nitride (InGaN), indium aluminum nitride (InAlN), and the like. In one or more specific embodiments, the III-nitride layer 802 comprises gallium nitride. In some embodiments, the III-nitride layer 802 and the III-nitride layer 212 comprise the same material. In other embodiments, the III-nitride layer 802 and the III-nitride layer 212 comprise different III-nitride materials. In a specific embodiment, III-nitride layer 802 comprises gallium nitride (GaN). In one or more embodiments, the second III-nitride layer 802 is an n-type layer and comprises n-type GaN.

In one or more embodiments, the III-nitride layer 802 is placed in a metalorganic vapor-phase epitaxy (MOVPE) reactor for epitaxy of LED device layers. Unlike during a typical MOVPE growth run, which starts with a low temperature nucleation layer, in one or more embodiments the MOVPE process starts with high temperature III-nitride growth taking advantage of the large difference in III-nitride nucleation rates on the pre-deposited nucleation layer 204 versus the surfaces of patterned dielectric layer with the first plurality of features 208. In one or more embodiments, after the epitaxy, e.g., MOVPE, growth run, the device 200 is processed as is typical for a conventional PSS based LED.

Referring to FIG. 2E, in one or more embodiments, a multi-quantum well layer 808 is grown on the III-nitride layer 802 before a p-type layer 810. In one or more embodiments, the multi-quantum well layer 808 is comprised of one or more of indium gallium nitride (InGaN) and gallium nitride (GaN).

An anode metal layer 812 is formed on the p-type layer 810. The anode metal layer 812 may comprises any suitable material known to the skilled artisan. In one or more embodiments, the anode metal layer 812 comprises silver (Ag). The semiconductor layers may then be etched to form a cathode via. In one or more embodiments, the cathode via is filled with a metal cathode layer 806, or an n-type contact. In one or more embodiments, the cathode layer 806 may comprise any suitable material known to the skilled artisan. In one or more embodiments, the cathode layer 806 comprises an n-contact material, such as, but not limited to, aluminum (Al).

For simplicity, FIG. 2E shows only one of many cathode vias that may exist in the actual device. The anode 812 and cathode 806 metals may be a composite of several metal layers, shown in the drawing as single layers for clarity.

In one or more embodiments, the contact vias are much larger in size than the pattern features 208. In one or more embodiments, the contact vias are not aligned to the pattern features 208.

In some embodiments, a dielectric material 818 is deposited in the cathode via to provide isolation for the via. The dielectric material 818 may comprise any suitable material known to the skilled artisan. In one or more embodiments, the dielectric material 818 includes, but is not limited to, oxides, e.g., silicon oxide ($SiO_2$), aluminum oxide ($Al_2O_3$), nitrides, e.g., silicon nitride ($Si_3N_4$). In one or more embodiments, the dielectric material 818 comprises silicon nitride ($Si_3N_4$). In one or more embodiments, the dielectric material 818 comprises silicon oxide ($SiO_2$). The dielectric material 818 may be a composite of several layers, shown in the figure as a single layer for clarity.

In one or more embodiments, a cathode bond pad 808 is deposited on the top surface of the cathode layer 806. The cathode bond pad 808 may comprise any suitable material known to the skilled artisan. In one or more embodiments, an anode bond pad 814 is formed on a top surface of the anode metal layer 812. The anode bond pad 814 may comprise any suitable material known to the skilled artisan.

In one or more embodiments, a reflective coating 816 is formed on the sides of the device 200. The reflective coating 816 may comprise any suitable material known to the skilled artisan.

Figure 4A:
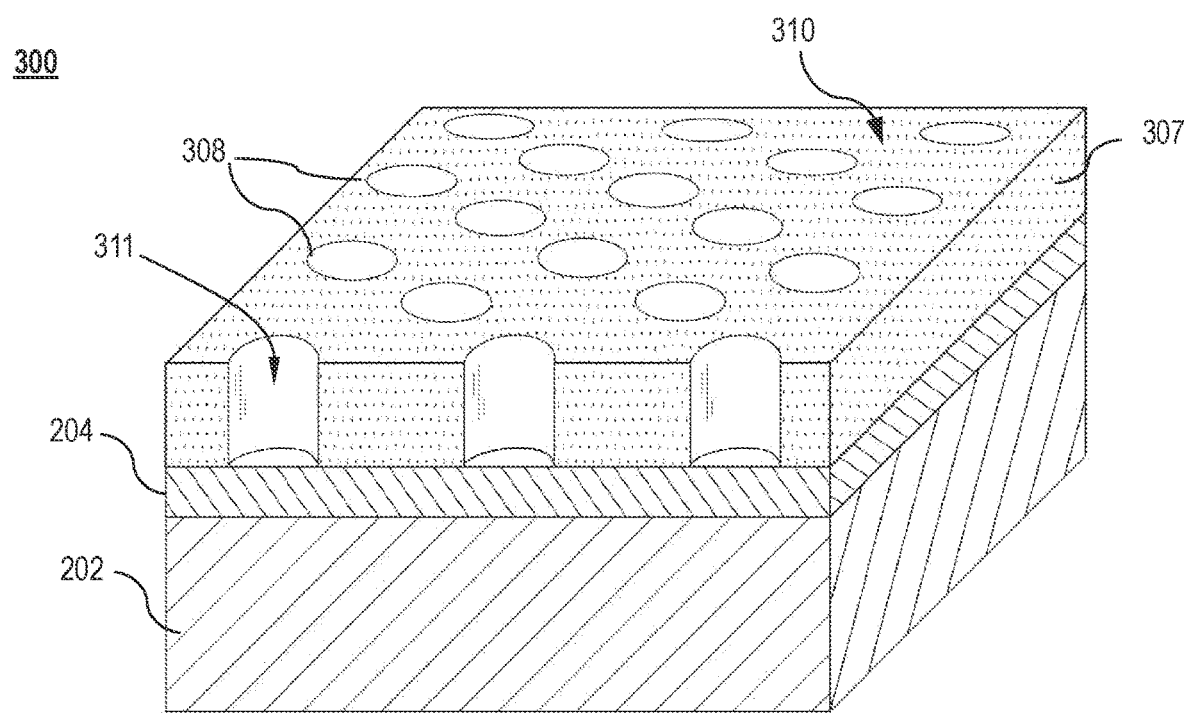
FIG. 4A illustrates a perspective view of a light emitting diode (LED) device according to one or more embodiments.
Figure 4B:
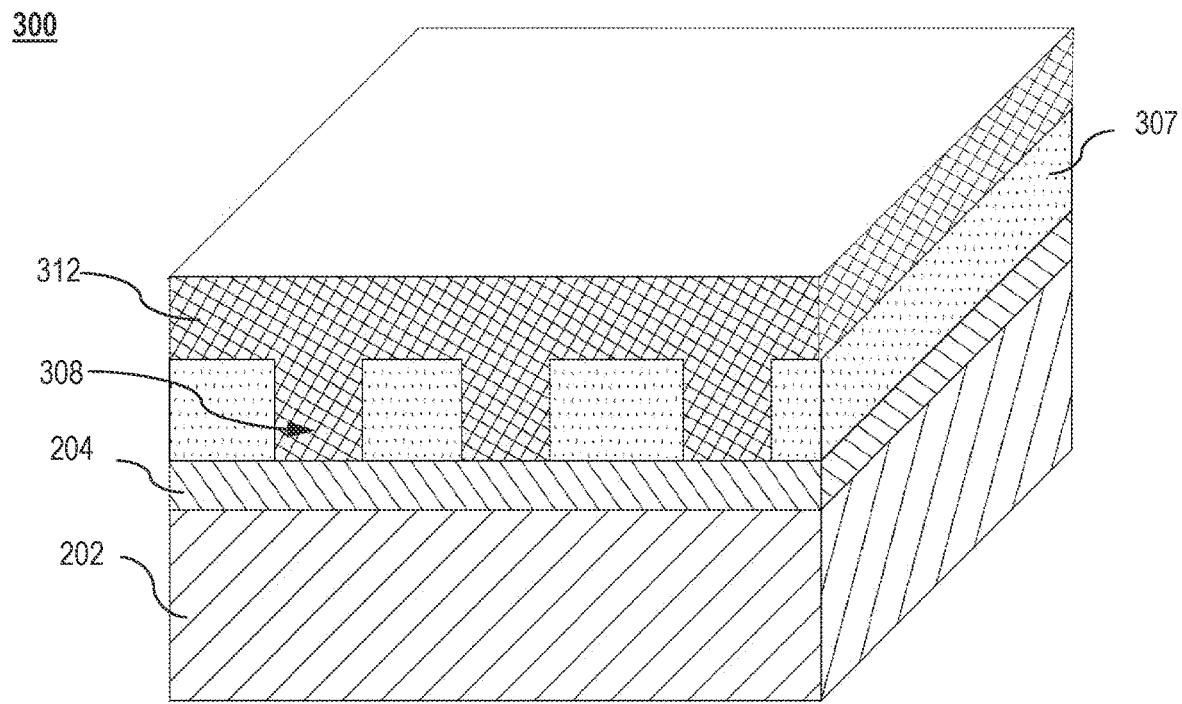
FIG. 4B illustrates a perspective view of a light emitting diode (LED) device according to one or more embodiments.

FIGS. 4A and 4B are perspective views of a LED device according to one or more embodiments. With reference to FIG. 4A, a nucleation layer 204 has been deposited on a substrate 202, and a dielectric layer 206 has been deposited on the nucleation layer 204, as described above. Referring to FIG. 4A, the dielectric layer 206 is then patterned by any appropriate patterning technique known to one of skill in the art. In one or more embodiments, the patterned dielectric layer 307 has a plurality of features 308. In one or more embodiments, the plurality of features 308 comprise holes 311 that extend to the nucleation layer 204. In one or more embodiments, the holes 311 are any appropriate shape or size known to one of skill in the art. For example, in some embodiments, the plurality of features 308 or the holes 311 have a diameter in a range of from about 50 nm to about 5000 nm. In one or more embodiments, the plurality of features 308 has a depth that is equal to the thickness of the dielectric layer 204. For the embodiments based on pattern holes in a dielectric layer 204, the depth of the holes may be at least equal to the thickness of the dielectric layer. In some embodiments, the depth of the holes may extend up to about 500 nm deeper than the thickness of the dielectric layer 204.

In one or more embodiments, the holes 311 are regularly spaced. In other embodiments, the holes 311 are irregularly spaced. In one or more embodiments, the plurality of features 308 (i.e., holes 311) have a plurality of spaces 310 between the plurality of features 308.

Referring to FIG. 4B, a III-nitride layer 312 is grown, e.g., epitaxially, on the patterned dielectric layer 307. In one or more embodiments, the III-nitride layer 312 fills the plurality of features 308 (i.e., holes 311) and comes in contact with the nucleation layer 204.

In one or more embodiments, the III-nitride layer 312 comprises a III-nitride material. In some embodiments, the III-nitride material comprises one or more of gallium (Ga), aluminum (Al), and indium (In). Thus, in some embodiments, the III-nitride layer 312 comprises one or more of gallium nitride (GaN), aluminum nitride (AlN), indium nitride (InN), gallium aluminum nitride (GaAlN), gallium indium nitride (GaInN), aluminum gallium nitride (AlGaN), aluminum indium nitride (AlInN), indium gallium nitride (InGaN), indium aluminum nitride (InAlN), and the like. In one or more specific embodiments, the III-nitride layer 312 comprises gallium nitride. In some embodiments, the III-nitride layer 312 and the nucleation layer 204 comprise the same III-nitride material. In other embodiments, the III-nitride layer 312 and the nucleation layer 204 comprise different III-nitride materials. In a specific embodiment, the nucleation layer 204 comprises aluminum nitride (AlN) and the III-nitride layer 312 comprises gallium nitride (GaN).

In one or more embodiments, the growth method disclosed herein (i.e., forming an epitaxial nucleation layer on the substrate before forming a plurality of features in the dielectric layer) avoids nucleation of misoriented grains onto patterned features, making it easier to grow smooth device-quality III-nitride layers over patterned features. Additionally, in one or more embodiments, the patterned features are packed more densely together than would be possible with current state-of-the-art methods that utilize etching of sapphire before nucleation layer deposition because of the selective area growth around the dielectric patterns.

Figure 5:
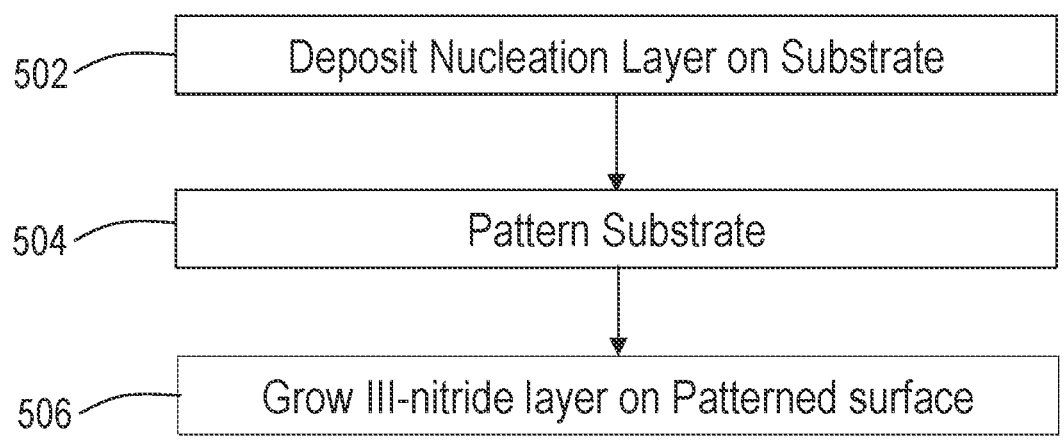
FIG. 5 illustrates a process flow diagram for a method according to one or more embodiments.

FIG. 5 depicts a flow diagram of a method 500 of manufacturing a light emitting diode (LED) device in accordance with one or more alternative embodiments of the present disclosure. With reference to FIG. 5, in one or more embodiments, the method begins at operation 502 by depositing a nucleation layer on a substrate. At operation 504 the substrate is patterned. At operation 506, a III-nitride layer is selectively grown, e.g., epitaxially, on the nucleation layer.

Figure 6A:
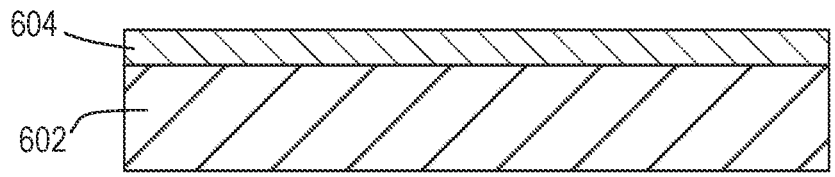
FIG. 6A illustrates a cross-sectional view of a light emitting diode (LED) device according to one or more embodiments.

FIG. 6A is cross-section view of a LED device according to one or more embodiments. With reference to FIG. 6A, a nucleation layer 604 is deposited on a substrate 602.

In one or more embodiments, the substrate 602 is any suitable substrate known to one of skill in the art, including any of the substrates described through the disclosure. In one or more specific embodiments, the substrate 602 comprises sapphire.

Without intending to be bound by theory, it is thought that the deposition of a nucleation layer 604 on the substrate 602 prior to patterning provides critical advantages. In one or more embodiments, it was found that the deposition of a nucleation layer 604 on the substrate 602 prior to patterning provided performance improvements for directional emitters with the growth substrate remaining attached in the finished device. In one or more embodiments, the performance improvements include increased light extraction efficiency (ExE) in emitters without a lens (dome), increased brightness, and increased angular directionality (forward gain, effective increased lumen output within a narrow angular emission cone (e.g., 45 degrees)

In one or more embodiments, the nucleation layer 604 is deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD).

In one or more embodiments, the nucleation layer 604 comprises a III-nitride material. In some embodiments, the III-nitride material comprises one or more of gallium (Ga), aluminum (Al), and indium (In). Thus, in some embodiments, the nucleation layer 604 comprises one or more of gallium nitride (GaN), aluminum nitride (AlN), indium nitride (InN), gallium aluminum nitride (GaAlN), gallium indium nitride (GaInN), aluminum gallium nitride (AlGaN), aluminum indium nitride (AlInN), indium gallium nitride (InGaN), indium aluminum nitride (InAlN), and the like. In one or more specific embodiments, the nucleation layer 604 comprises aluminum nitride (AlN).

In one or more embodiments, the nucleation layer 604 has a thickness in a range of from about 5 nm to about 100 nm, including a range of from about 10 nm to 75 nm, a range of from about 5 nm to about 90 nm, a range of from about 10 nm to about 60 nm, a range of from about 5 nm to about 50 nm, a range of from about 10 nm to about 50 nm, and a range of from about 10 nm to about 90 nm.

Figure 6B:
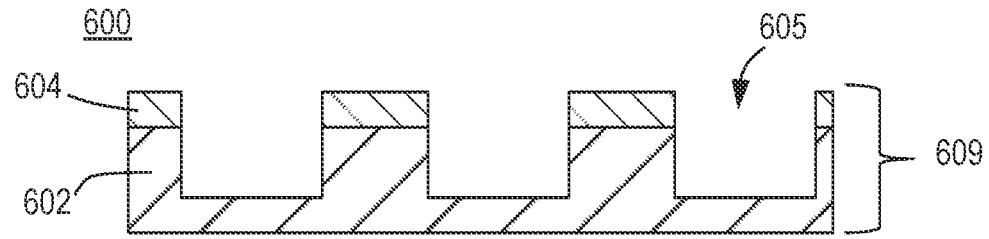
FIG. 6B illustrates a cross-sectional view of a light emitting diode (LED) device according to one or more embodiments.

FIG. 6B is cross-section view of a LED device according to one or more embodiments. With reference to FIG. 6B, the substrate 602 and nucleation layer 604 are patterned to form voids 605. In one or more embodiments, the voids 605 have any shape known to the skilled artisan, including, but not limited to, rectangular, triangular, oval, rounded, hexagonal, and the like.

In one or more embodiments, the plurality of voids 605 may have a thickness approximately determined by the depth of the substrate etch step. In one or more embodiments, the depth of the plurality of voids 605 may be in a range of from about 50 nm to about 5000 nm.

In one of more embodiments, the plurality of voids 605 has a pitch in a range of from about 50 nm to about 5000 nm, including a range from about 500 nm to about 2000 nm, and a range of from about 500 nm to about 1000 nm.

In one or more embodiments, the plurality of voids has a width in a range of from about 5 nm to about 500 nm, including a range from about 10 nm to about 500 nm, and a range of from about 5 nm to about 300 nm.

In one or more embodiments, a hexagonal pattern of voids 605 is transferred to a photoresist coating (not illustrated) on the nucleation layer 204 using conventional photolithography. In one or more embodiments, the device 600 is etched to a depth in an RIE tool using conditions that efficiently etch both the nucleation layer 204 and the substrate 202, resulting in a void having substantially vertical sidewall angles. In one or more embodiments, after removing the photoresist (not illustrated) and cleaning the device 600, the result is an array of nucleation layer-coated substrate posts 609.

Figure 6C:
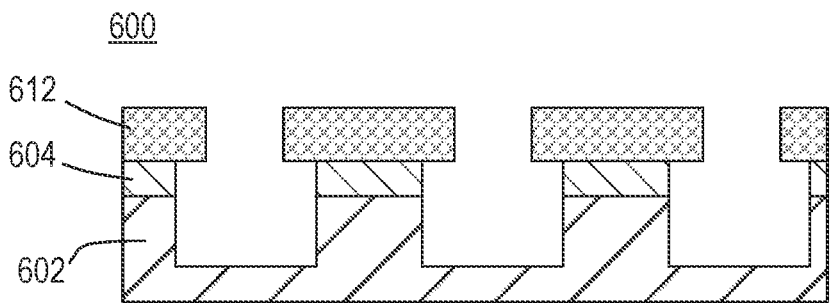
FIG. 6C illustrates a cross-sectional view of a light emitting diode (LED) device according to one or more embodiments.
Figure 6D:
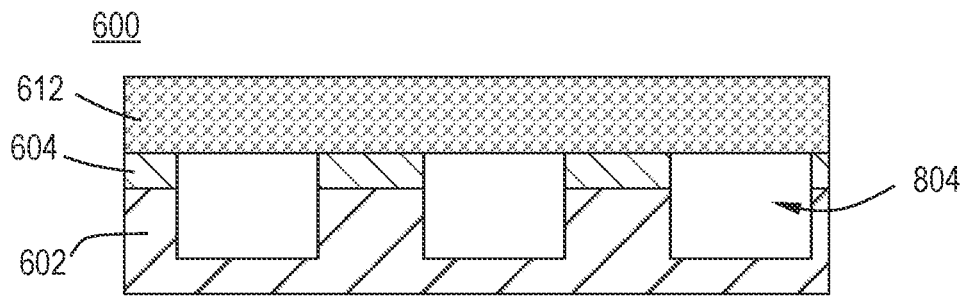
FIG. 6D illustrates a cross-sectional view of a light emitting diode (LED) device according to one or more embodiments.

FIG. 6C is cross-section view of a LED device according to one or more embodiments. With reference to FIG. 6C, a III-nitride layer 612 is grown, e.g., epitaxially, on the nucleation layer-coated substrate posts 609. FIG. 6D is cross-section view of a LED device according to one or more embodiments. With reference to FIG. 6D, the III-nitride layer 612 is grown, e.g., epitaxially, laterally on the nucleation layer-coated substrate posts 609.

In one or more embodiments, the III-nitride layer 612 comprises a III-nitride material. In some embodiments, the III-nitride material comprises one or more of gallium (Ga), aluminum (Al), and indium (In). Thus, in some embodiments, the III-nitride layer 612 comprises one or more of gallium nitride (GaN), aluminum nitride (AlN), indium nitride (InN), gallium aluminum nitride (GaAlN), gallium indium nitride (GaInN), aluminum gallium nitride (AlGaN), aluminum indium nitride (AlInN), indium gallium nitride (InGaN), indium aluminum nitride (InAlN), and the like. In one or more specific embodiments, the III-nitride layer 612 comprises gallium nitride. In some embodiments, the III-nitride layer 612 and the nucleation layer 604 comprise the same III-nitride material. In other embodiments, the III-nitride layer 612 and the nucleation layer 604 comprise different III-nitride materials. In a specific embodiment, the nucleation layer 604 comprises aluminum nitride (AlN) and the III-nitride layer 612 comprises gallium nitride (GaN).

In one or more embodiments, the device 600 is loaded into a MOVPE reactor for epitaxy of LED device layers. Unlike during a typical MOVPE growth run, which starts with a low temperature nucleation layer, in one or more embodiments the MOVPE process starts with high temperature III-nitride growth taking advantage of the large difference in III-nitride nucleation rates on the pre-deposited nucleation layer 604 versus the etched substrate 602 surfaces not covered by the nucleation layer 604. In one or more embodiments, the III-nitride layer grows laterally and coalesces above the voids 605 in the substrate 202 leaving an array of buried void features. In one or more embodiments, the voids 605 have a refractive index equal to 1, as the voids are filled with air. In one or more embodiments, after the MOVPE growth run, subsequent processing of the device 600 follows as usual for a conventional PSS based LED.

When the III-nitride layer 612 is grown, a plurality of voids 804 are formed because the III-nitride layer 212 does not nucleate on the sidewalls. The plurality of voids 804 may have any shape or size. In some embodiments, the plurality of voids 804 are bounded by the III-nitride layer 612, by the nucleation layer 604, and by the substrate 602.

In one or more embodiments, the plurality of voids 804 has a pitch in a range of from about 50 nm to about 5000 nm, including a range from about 500 nm to about 2000 nm, and a range of from about 500 nm to about 1000 nm. In one or more embodiments, the plurality of voids 804 has a width in a range of from about 5 nm to about 500 nm, including a range from about 10 nm to about 500 nm, and a range of from about 5 nm to about 300 nm. The voids typically have a distribution of different shapes and sizes. When viewed in cross-section, the voids 804 may appear in the shape of a rectangle or a square. Some voids may appear elliptical in cross-section. The size of each void is typically less than 500 nm and can be in a range of from 10 nm to 100 nm. A distribution of various sizes of voids can be found within the same device.

Figure 6E:
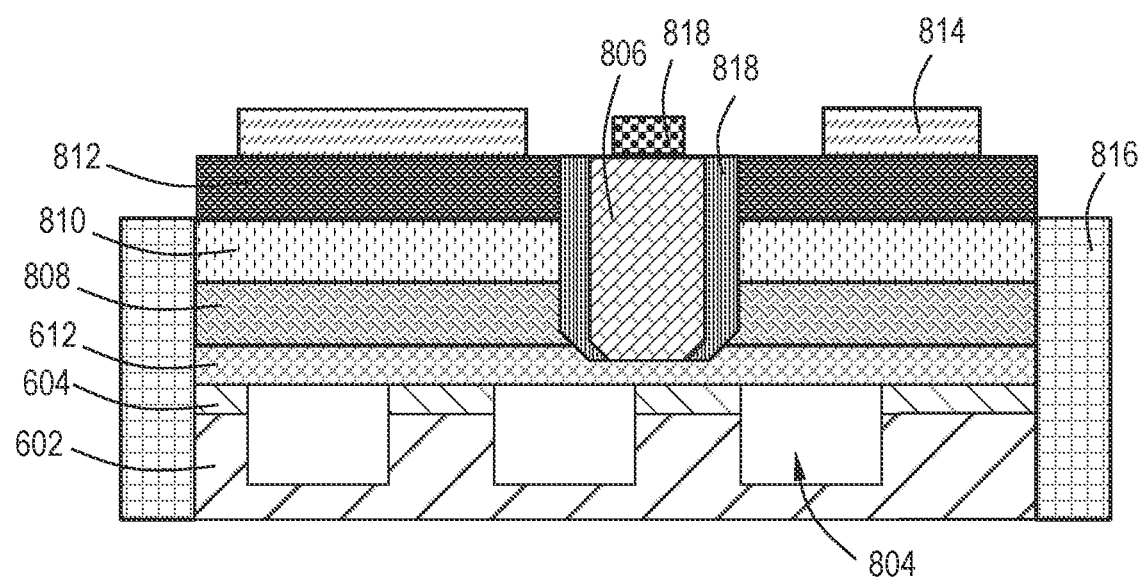
FIG. 6E illustrates a cross-sectional view of a light emitting diode (LED) device according to one or more embodiments.

Referring to FIG. 6E, in one or more embodiments, a multi-quantum well layer 808 is grown on the III-nitride layer 612 before a p-type layer 810. In one or more embodiments, the multi-quantum well layer 808 is comprised of one or more of indium gallium nitride (InGaN) and gallium nitride (GaN).

An anode metal layer 812 is formed on the p-type layer 810. The anode metal layer 812 may comprises any suitable material known to the skilled artisan. In one or more embodiments, the anode metal layer 812 comprises silver (Ag). The semiconductor layers may then be etched to form a cathode via. In one or more embodiments, the cathode via is filled with a metal cathode layer 806, or an n-type contact. In one or more embodiments, the cathode layer 806 may comprise any suitable material known to the skilled artisan. In one or more embodiments, the cathode layer 806 comprises an n-contact material, such as, but not limited to, aluminum (Al).

For simplicity, FIG. 6E shows only one of many cathode vias that may exist in the actual device. The anode 812 and cathode 806 metals may be a composite of several metal layers, shown in the drawing as single layers for clarity.

In one or more embodiments, the contact vias are much larger in size than the voids 804. In one or more embodiments, the contact vias are not aligned to the voids 804.

In some embodiments, a dielectric material 818 is deposited in the cathode via to provide isolation for the via. The dielectric material 818 may comprise any suitable material known to the skilled artisan. In one or more embodiments, the dielectric material 818 includes, but is not limited to, oxides, e.g., silicon oxide ($SiO_2$), aluminum oxide ($Al_2O_3$), nitrides, e.g., silicon nitride ($Si_3N_4$). In one or more embodiments, the dielectric material 818 comprises silicon nitride ($Si_3N_4$). In one or more embodiments, the dielectric material 818 comprises silicon oxide ($SiO_2$). The dielectric material 818 may be a composite of several layers, shown in the figure as a single layer for clarity.

In one or more embodiments, a cathode bond pad 808 is deposited on the top surface of the cathode layer 806. The cathode bond pad 808 may comprise any suitable material known to the skilled artisan. In one or more embodiments, an anode bond pad 814 is formed on a top surface of the anode metal layer 812. The anode bond pad 814 may comprise any suitable material known to the skilled artisan.

In one or more embodiments, a reflective coating 816 is formed on the sides of the device 200. The reflective coating 816 may comprise any suitable material known to the skilled artisan.

Without intending to be bound by theory, it is thought that performance improvements of the LED device of one or more embodiments are, in part, a consequence of fabricating the plurality of features from a material with lower refractive index, e.g., low refractive index dielectric material or voids (air), than a substrate, such as a sapphire substrate. In one or more embodiments, the low refractive index features 208 or voids 605 produce a narrow beam angular profile, which is significantly lower than that produced by state-of the art patterned sapphire substrate (PSS), even in side-coated architectures. In one or more embodiments, the narrowing level is quantified by defining a forward-gain parameter (fwdGain). The fwdGain may be defined with respect to different cone angles, e.g., 5 deg, 45 deg and 60 deg, and helps establish the relative level of light concentration within a given cone angle centered at normal. The higher the fwdGain is, the higher the concentration of light. In typical reference, PSS LED emitters with side-coating have a fwdGain (45)<0.5, with a full width half max (FWHM)>120 deg. In one or more embodiments, the product of fwdGain and light extraction efficiency (ExE) allows quantifying the relative flux gains concentrated within a given angular acceptance cone.

Figure 7:
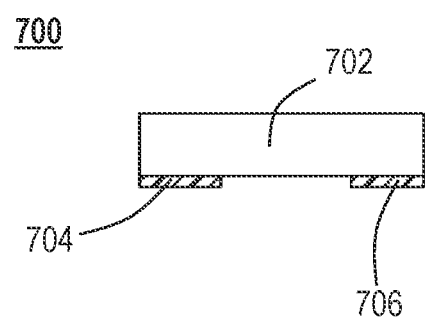
FIG. 7 illustrates a cross-section view of an exemplary LED package according to one or more embodiments.

The LED device of one of more embodiments is useful in any product known to one of skill in the art which uses a side-coated chip-scale package (CSP) architecture. As used herein, the term "chip-scale package (CSP)" refers to a type of integrated circuit package. In one or more embodiments, a chip-scale package is provided which has an area no greater than about 1.2 times that of the die, which is a single-die, direct surface mountable package. In one or more embodiments, the CSP has a ball pitch that is less than or equal to about 1 mm. FIG. 7 is a cross-section view of an exemplary LED package 700 according to one or more embodiments. Referring to FIG. 7, a chip-scale package (CSP) LED unit 700 comprising the LED device 702 of one or more embodiments. An anode 704 and a cathode 706 are soldered to the LED device 702.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

EXAMPLES

Example 1: $SiO_2$ Pattern Features

A nucleation layer of AlN was deposited on a non-patterned sapphire substrate using a sputter deposition tool. A $SiO_2$ layer of thickness 800 nm was coated over the AlN layer using plasma-enhanced chemical vapor deposition (PECVD). A hexagonal pattern of circles having a pitch of 1000 nm and a circle diameter of 200 nm was transferred to a photoresist coating on the $SiO_2$ layer using nanoimprint lithography. The wafer was etched in a reactive ion etching (RIE) tool using conditions that etch $SiO_2$ efficiently but etch AlN very slowly or not at all. After the photoresist was removed and the wafer cleaned, the result was a hexagonal array of cones of $SiO_2$. The half-angle of the cones was about 35 degrees and was controlled by adjusting parameters such as the thickness of the starting $SiO_2$ layer, thickness of photoresist layer, and differences in RIE etch rates that depend on surface angles and/or materials. The wafer was then loaded into a III-nitride MOVPE reactor for epitaxy of LED device layers. Unlike a typical MOVPE growth run which starts with a low temperature nucleation layer, the MOVPE process in this case started with high temperature GaN growth taking advantage of the large difference in GaN nucleation rates on the predeposited AlN vs. the surfaces of the $SiO_2$ cone features. After the MOVPE growth run, Subsequent processing of the wafer followed as usual for a conventional PSS based LED.

Example 2: Void Pattern Features

A nucleation layer of AlN was deposited on a non-patterned sapphire substrate using a sputter deposition tool. A hexagonal pattern of voids having a pitch of 2000 nm and a void diameter of 750 nm was transferred to a photoresist coating on the AlN layer using conventional photolithography. The wafer was etched to a depth of 600 nm in an RIE tool using conditions that efficiently etch both AlN and sapphire resulting in a nearly vertical sidewall angle. After removing the photoresist and cleaning the wafer the result was an array of AlN-coated sapphire posts. The wafer was then loaded into a III-nitride MOVPE reactor for epitaxy of LED device layers. Unlike a typical MOVPE growth run which starts with a low temperature nucleation layer, the MOVPE process in this case started with high temperature GaN growth taking advantage of the large difference in GaN nucleation rates on the pre-deposited AlN vs. the etched sapphire surfaces not covered by AlN. The GaN grows laterally and coalesces above the voids in the sapphire leaving an array of buried void features with refractive index=1. After the MOVPE growth run subsequent processing of the wafer follows as usual for a conventional PSS based LED.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A light emitting diode device comprising:
   a nucleation layer on a substrate, the nucleation layer comprising a III-nitride material;
   a patterned dielectric layer on a top surface of the nucleation layer, the patterned dielectric layer comprising a plurality of features and having a plurality of spaces between the plurality of features, wherein the plurality of features have a top surface and sidewalls, and wherein the plurality of spaces provide one or more exposed portions of the top surface of the nucleation layer;
   a first III-nitride layer disposed within the plurality of spaces, the first III-nitride layer comprising a first III-nitride material, wherein the first III-nitride layer is on a bottom portion of the sidewalls of the plurality of features and on the one or more exposed portions of the top surface of the nucleation layer within the plurality of spaces, and wherein the first III-nitride layer is not on an upper portion of the sidewalls of the plurality of features;
   a second III-nitride layer on the first III-nitride layer, the second III-nitride layer comprises a second III-nitride material;
   a plurality of voids disposed between the upper portion of the sidewalls of the plurality of features having no first III-nitride layer thereon, the first III-nitride layer, and the second III-nitride layer;
   an anode layer on the second III-nitride layer; and
   a cathode layer in a cathode via.

2. The light emitting diode device of claim 1, wherein the plurality of features have a height in a range of from 100 nm to 3 µm.

3. The light emitting diode device of claim 1, where the plurality of features have a pitch in a range of from 50 nm to 5000 nm.

4. The light emitting diode device of claim 1, wherein the plurality of features have a width in a range of from 5 nm to 500 nm.

5. The light emitting diode device of claim 1, wherein the plurality of features have a shape selected from a hemispherical shape, a triangular pyramidal shape, a quadrangular pyramidal shape, a hexagonal pyramidal shape, a conical shape, a semi-spherical shape, or a cut-spherical shape.

6. The light emitting diode device of claim 1, wherein the first III-nitride material and the second III-nitride material independently comprise one or more of aluminum, gallium, and indium.

7. The light emitting diode device of claim 6, wherein the first III-nitride material and the second III-nitride material are the same.

8. The light emitting diode device of claim 1, wherein the patterned dielectric layer comprises a low refractive index material having a refractive index in a range of from about 1.2 to about 2.

9. The light emitting diode device of claim 8, wherein the patterned dielectric layer comprises one or more of silicon oxide ($SiO_2$) and silicon nitride ($Si_3N_4$).

10. The light emitting diode device of claim 1, wherein the first III-nitride material and the second III-nitride material comprises gallium nitride (GaN).

11. A method of manufacturing the light emitting diode device of claim 1, the method comprising:

depositing a nucleation layer on a substrate, the nucleation layer comprising a nucleation III-nitride material, the nucleation layer having a thickness in a range of from about 5 nm to about 100 nm;

depositing a dielectric layer on a top surface of the nucleation layer, the dielectric layer comprising a low refractive index dielectric material;

patterning the dielectric layer to form a patterned dielectric layer having a plurality of features and a plurality of spaces between the plurality of features, wherein the plurality of features have a top surface and sidewalls, the sidewalls of the plurality of features having a bottom portion and an upper portion, wherein the plurality of spaces provide one or more exposed portions of the top surface of the nucleation layer;

epitaxially growing a first III-nitride layer on the patterned dielectric layer, wherein the first III-nitride layer is grown on the bottom portion of the sidewalls of the plurality of features and on the one or more exposed portions of the top surface of the nucleation layer within the plurality of spaces, and wherein the first III-nitride layer is not grown on the upper portion of the sidewalls of the plurality of features; and epitaxially growing a second III-nitride layer on the first III-nitride layer, the second III-nitride layer forming a plurality of voids from the plurality of spaces, the plurality of voids disposed between the upper portion of the sidewalls of the plurality of features having no first III-nitride layer thereon, the first III-nitride layer, and the second III-nitride layer.

12. The method of claim 11, wherein the plurality of features protrude from a top surface of the nucleation layer and have a height and a width and sidewalls, and the plurality of features having a shape selected from a hemispherical shape, a triangular pyramidal shape, a quadrangular pyramidal shape, a hexagonal pyramidal shape, a conical shape, a semi-spherical shape, or a cut-spherical shape.

13. The method of claim 11, wherein the plurality of features have a height in a range of from 100 nm to 3 μm, a pitch in a range of from 50 nm to 5000 nm, and a width in a range of from 5 nm to 500 nm.

14. The method of claim 11, wherein the nucleation layer is deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD).

15. The method of claim 11, wherein the nucleation layer has a thickness in a range of from 5 nm to 50 nm.

16. The method of claim 11, further comprising forming the anode layer on a top surface of the second III-nitride layer.

17. The method of claim 16, further comprising forming a via extending from a top surface of the anode layer to the second III-nitride layer.

18. The method of claim 17, further comprising depositing one or more of a dielectric layer and the cathode layer in the via.

19. The method of claim 18, further comprising forming one or more of an anode bond pad and a cathode bond pad.

20. A light emitting diode device comprising:
a patterned dielectric layer on a substrate, the patterned dielectric layer comprising a plurality of features and having a plurality of spaces between the plurality of features, wherein the plurality of features have a top surface and sidewalls; and
a first III-nitride layer on the plurality of features and on the plurality of spaces, the first III-nitride layer comprising a first III-nitride material, wherein the first III-nitride layer is on a bottom portion of the sidewalls of the plurality of features and on the plurality of spaces, and wherein the first III-nitride layer is not on an upper portion of the sidewalls of the plurality of features;
a second III-nitride layer on the first III-nitride layer, the second III-nitride layer comprises a second III-nitride material;
an anode layer on the second III-nitride layer; and
a cathode layer in a cathode via,
wherein the first III-nitride material and the second III-nitride material comprise one or more of aluminum, gallium, and indium, and wherein the first III-nitride material and the second III-nitride material are the same.

21. A light emitting diode device comprising:
a patterned dielectric layer on a substrate, the patterned dielectric layer comprising a plurality of features and having a plurality of spaces between the plurality of features, wherein the plurality of features have a top surface and sidewalls; and
a first III-nitride layer on the plurality of features and on the plurality of spaces, the first III-nitride layer comprising a first III-nitride material, wherein the first III-nitride layer is on a bottom portion of the sidewalls of the plurality of features and on the plurality of spaces, and wherein the first III-nitride layer is not on an upper portion of the sidewalls of the plurality of features;
a second III-nitride layer on the first III-nitride layer, the second III-nitride layer comprises a second III-nitride material;
an anode layer on the second III-nitride layer; and a cathode layer in a cathode via,
wherein the first III-nitride material and the second III-nitride material comprises gallium nitride (GaN).

* * * * *